US010607664B2

(12) United States Patent
Fantini et al.

(10) Patent No.: US 10,607,664 B2
(45) Date of Patent: Mar. 31, 2020

(54) SUB-THRESHOLD VOLTAGE LEAKAGE CURRENT TRACKING (71) Applicant: Micron Technology, Inc., Boise, ID (US)

(72) Inventors: Paolo Fantini, Vimercate (IT); Paolo Amato, Treviglio (IT); Marco Sforzin, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/928,831

(22) Filed: Mar. 22, 2018

(65) Prior Publication Data
US 2019/0295610 A1 Sep. 26, 2019

(51) Int. Cl.
*G11C 7/00* (2006.01)
*G11C 7/06* (2006.01)
*G11C 16/10* (2006.01)
*G11C 13/00* (2006.01)
*G11C 16/26* (2006.01)

(52) U.S. Cl.
CPC .............. *G11C 7/06* (2013.01); *G11C 13/004* (2013.01); *G11C 13/0069* (2013.01); *G11C 16/10* (2013.01); *G11C 16/26* (2013.01); *G11C 2213/31* (2013.01)

(58) Field of Classification Search
CPC ...... G11C 7/06; G11C 13/004; G11C 13/0069
USPC ..................................................... 365/189.15
See application file for complete search history.

(56) References Cited

U.S. PATENT DOCUMENTS

| 6,052,307 A * | 4/2000 | Huber ...................... G11C 7/14 |
| | | 327/52 |
| 6,323,693 B1 * | 11/2001 | Park ....................... G11C 7/062 |
| | | 327/52 |
| 7,054,197 B2 | 5/2006 | Vimercati |
| 7,321,512 B2 | 1/2008 | Vimercati et al. |
| 7,345,905 B2 | 3/2008 | Pio et al. |
| 7,554,861 B2 | 6/2009 | Vimercati et al. |
| 8,432,732 B2 | 4/2013 | Li et al. |
| 8,514,630 B2 | 8/2013 | Huynh et al. |
| 8,767,482 B2 | 7/2014 | Hirst et al. |
| 9,460,784 B1 | 10/2016 | Pellizzer |
| 9,922,716 B2 | 3/2018 | Hsiung et al. |
| 2001/0028588 A1 | 10/2001 | Yamada et al. |
| 2006/0181915 A1 | 8/2006 | Oh et al. |
| 2008/0055966 A1 * | 3/2008 | Ramaraju ................ G11C 5/14 |
| | | 365/154 |

(Continued)

FOREIGN PATENT DOCUMENTS

| TW | 201319801 | 5/2013 |
| TW | 201729199 A | 8/2017 |

OTHER PUBLICATIONS

U.S. Appl. No. 15/619,158, filed Jun. 9, 2017, Micron Ref. No. 2016-0497.00/US, 83 pages.

(Continued)

Primary Examiner — Vu A Le
(74) Attorney, Agent, or Firm — Brooks, Cameron & Huebsch, PLLC (57) ABSTRACT An apparatus has an array of memory cells and a controller coupled to the array. The controller is configured to track a sub-threshold leakage current through a number of memory cells of the array and determine a threshold voltage based on the sub-threshold leakage current.

13 Claims, 10 Drawing Sheets (56) References Cited

U.S. PATENT DOCUMENTS

| | | |
|---|---|---|
| 2010/0195386 A1 | 8/2010 | Huh |
| 2013/0058167 A1 | 3/2013 | Wada |
| 2015/0071000 A1 | 3/2015 | Toshiba |
| 2016/0125940 A1* | 5/2016 | Kang ................. G11C 13/0004 365/148 |
| 2017/0125097 A1 | 5/2017 | Tortorelli et al. |

OTHER PUBLICATIONS

U.S. Appl. No. 15/619,163, filed Jun. 9, 2017, Micron Ref. No. 2017-0070.00/US, 85 pages.
Vimercati et al., "A 125MHz Burst-Mode Flexible Read-While-Write 256Mbit 2b/c 1.8V NOR Flash Memory", IEEE International Solid-State Circuits Conference, Digest of Technical Papers, Feb. 7, 2005, 3 pgs.
U.S. Appl. No. 15/853,328, filed Dec. 22, 2017, Micron Ref. No. 2017-0496.00/US, 61 pages.
U.S. Appl. No. 15/853,364, filed Dec. 22, 2017, Micron Ref. No. 2017-1039.00/US, 63 pages.
Knuth, "Efficient Balanced Codes", IEEE Transactions on Information Theory, vol. IT-32, No. 1, Jan. 1986, pp. 51-53.
Etzion et al., "A New Construction for Constant Weight Codes", IEEE 2014 International Symposium on Information Theory and it's Applications (ISITA), Oct. 26-29, 2014, 5 pages.
International Search Report and Written Opinion from related international application No. PCT/US2019/021581, dated Jun. 24, 2019, 13 pages.
Office Action from related Taiwan patent application No. 108109074, dated Sep. 17, 2019, 8 pages.

* cited by examiner

| | A | B | a0 | a1 | b0 | b1 |
|---|---|---|---|---|---|---|
| VDM1 | 0 | 0 | 0 | 1 | 0 | 1 |
| VDM2 | 1 | 0 | 1 | 0 | 0 | 1 |
| VDM3 | 0 | 1 | 0 | 1 | 1 | 0 |
| VDM4 | 1 | 1 | 1 | 0 | 1 | 0 |

FIG. 8C

SUB-THRESHOLD VOLTAGE LEAKAGE CURRENT TRACKING

TECHNICAL FIELD

The present disclosure relates generally to apparatus, such as storage systems, and their operation, and, more particularly, to tracking sub-threshold voltage leakage currents.

BACKGROUND

Memory devices can be provided as internal, semiconductor, integrated circuits and/or external removable devices in computers or other electronic systems. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), self-selecting memory (SSM), three dimensional cross point memory (e.g., 3D XPoint technology), resistive random access memory (RRAM), magnetic random access memory (MRAM), and programmable conductive memory, among others.

Memory cells are often arranged in an array architecture and are programmable to a number of different data states corresponding to one or more data units (e.g., bits). As an example, some memory cells, such as some resistance variable memory cells, can be programmed to a low threshold voltage (Vt) state (e.g., a "set" state) or a high Vt state (e.g., a "reset" state). The state of a memory cell can be determined by, for example, determining whether the cell changes its conductive state (e.g., experiences a switching event) in response to applying a sensing voltage, which may be referred to as a read voltage or a demarcation voltage, to (e.g., across) the cell.

DETAILED DESCRIPTION

The present disclosure is directed to technological improvements in reading memory cells, such as resistance variable memory cells. In some previous read approaches, fixed read voltages have been used to read memory cells. For example, the fixed read voltage may be selected to lie within a Vt window (e.g., read margin) between states (e.g., high and low Vt states). However, the Vt distributions of the cells can change as the cells age (e.g., as write cycle counts increase) and/or as their Vts drift subsequent to being written. The changing Vt distribution characteristics (e.g., due to cycling and/or drift) can lead to reliability issues associated with reading the cells using a fixed read voltage (e.g., demarcation voltage) since the Vt distributions and/or the read margin can vary. For instance, the read margin may shrink and may eventually close.

The present disclosure, solves the problems of previous approaches and improves the reliability of the read process by adjusting the read voltage to account for changing Vt distribution characteristics. For example, various Vt distribution characteristics (e.g., upper and/or lower edges) may be tracked by monitoring changes in the sub-threshold leakage current through a particular group or groups of memory cells, referred to as "tracking memory cells," which may experience the same number program cycles as the memory cells to be read.

Tracking memory cells correspond to a group of memory cells, such as a page or several pages of memory cells, to be read and may be included in the group to be read. The group of memory cells can experience the same number of write cycles as the tracking cells. Changes in the sub-threshold leakage current through the tracking cells with the number of write cycles applied to the tracking cells and/or with the time since the tracking cells are last written can be tracked. This allows changes in the Vt of the tracking cells, and thus the group of cells to be tracked, owing to a correlation between the sub-threshold leakage current and the Vt. A read voltage for reading the group of cells can be determined from the tracked Vt. As described further below, in a number of embodiments, a group of cells (e.g., a page) to be read may itself comprise tracking memory cells. Since, as described further herein, the sub-threshold leakage current can correlate with the Vt evolution of the memory cells, an appropriate read voltage for a group of cells may be determined based on a determined sub-threshold leakage current. The sub-threshold leakage current can be defined as the current through a cell in response to an applied voltage that is less than the Vt of the cell.

Another technological improvement involves determining when to perform a rejuvenation process on the memory cells (e.g., based on the sub-threshold leakage current). For example, rejuvenating a cell can increase the size of the window to that of a lower cycle count, and thus improve the reliability of reading the cell. Tracking the sub-threshold leakage current can allow the rejuvenation to occur before the window shrinks to the point at which reading the cell becomes unreliable.

In the following detailed description, reference is made to the accompanying drawings that form a part hereof, and in which is shown, by way of illustration, specific examples. In the drawings, like numerals describe substantially similar components throughout the several views. Other examples may be utilized and structural, logical, and/or electrical changes may be made without departing from the scope of the present disclosure. The following detailed description is, therefore, not to be taken in a limiting sense, and the scope of the present disclosure is defined only by the appended claims and equivalents thereof.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Figure 1A:
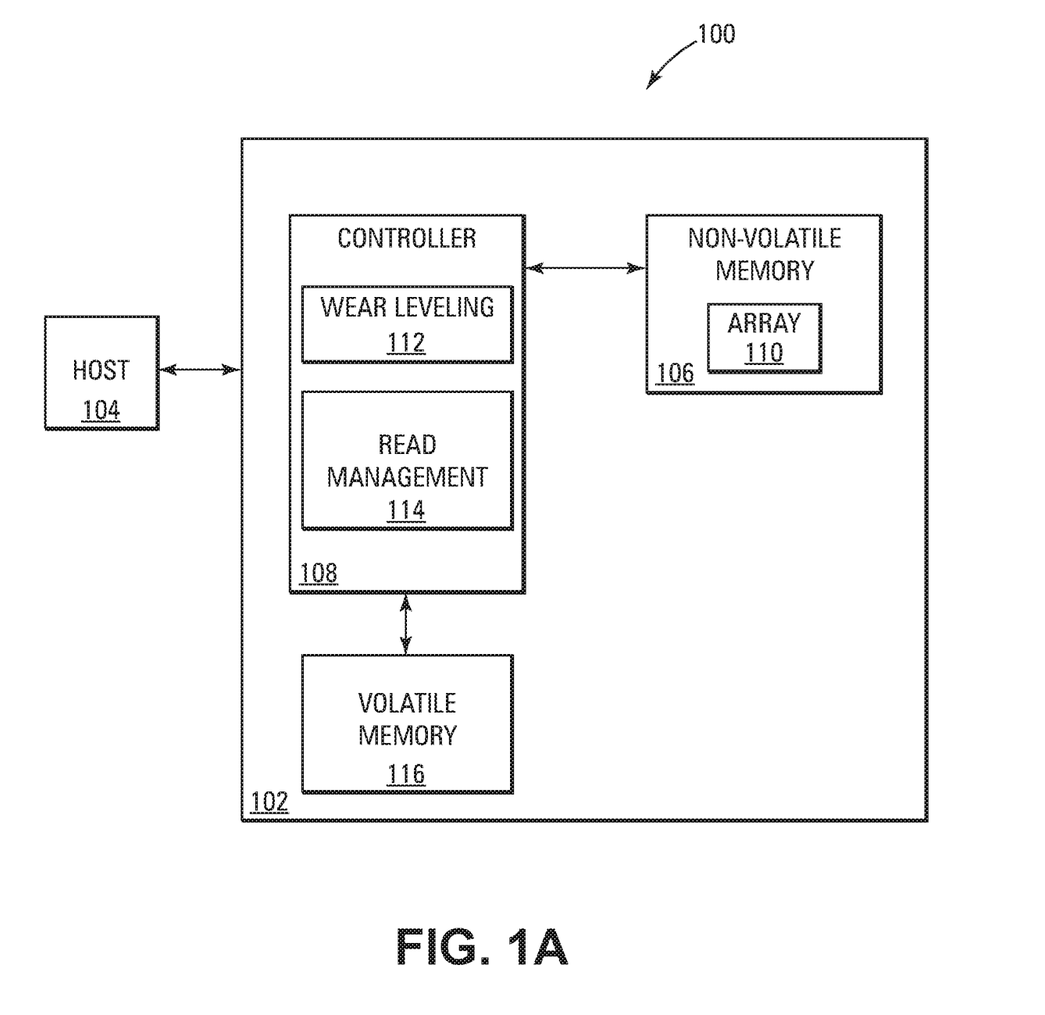
FIG. 1A is a block diagram of an apparatus, in accordance with a number of embodiments of the present disclosure.

FIG. 1A is a block diagram of an apparatus in the form of a computing system 100, in accordance with a number of embodiments of the present disclosure. Computing system 100 includes a storage system 102 that may be, for example, a solid-state drive (SSD). In the example of FIG. 1A, storage system 102 is coupled to a host 104 and includes a non-volatile memory 106, such as a cross-point memory, NAND flash memory, or NOR flash memory, among others. A controller 108 (e.g., an SSD controller), such as a processing device, is coupled to memory 106. In some examples, the controller 108 can comprise a state machine, a sequencer, and/or some other type of control circuitry that may be implemented in the form of an application specific integrated circuit (ASIC) coupled to a printed circuit board.

In some examples, memory 106 includes an array 110 of non-volatile memory cells, such as cross-point (e.g., three-dimensional cross-point) memory cells, NAND flash memory cells, or NOR flash memory cells, among others. Controller 108 includes a wear leveling component 112 and a read management component 114. A volatile memory 116, such as SRAM or DRAM, may be coupled to controller 108. In some examples, volatile memory 116 may include volatile registers and may be included in controller 108, such as in read management component 114.

Read management component 114 is configured to perform various methods disclosed herein. For example, read management component 114 can be configured to determine (e.g., measure) the sub-threshold leakage current (hereinafter the leakage current) through a number of tracking memory cells of memory array 110 in response to applying a sub-threshold voltage to the tracking cells, determine a sensing voltage based on the current, and read memory cells from array 110 using the sensing voltage. The read cells may or may not include the tracking memory cells. For example, as described below, a number of embodiments may include tracking leakage current of cells other than (e.g., separate from) a particular group of cells (e.g., page) to be read. However, in a number of embodiments, a page of cells to be read may itself comprise a number of tracking memory cells. The leakage current may be tracked (e.g., monitored) to determine a number of write cycles at which to rejuvenate the memory cells in array 110.

As used herein, a sub-threshold voltage refers to a voltage that is below the threshold voltage at which a memory cell changes from one conductive state, such as a low conductive state (e.g., high impedance state), to another conductive state, such as a high conductive state (e.g., low impedance state).

In some examples, configuration patterns, corresponding to sensing voltages determined from leakage currents through tracking cells in accordance with a number of embodiments of the disclosure, may be stored in volatile memory 116. The configuration pattern may be subsequently copied from volatile memory 116 into non-volatile memory 106 while storage device 102 is powering down, and then restored to volatile memory 116 while memory device 102 is powering up.

In some examples such as where no wear leveling occurs, tracking memory cells and configuration memory cells may be added to each page to be read in non-volatile memory 106. Configuration patterns corresponding to sensing voltages determined from the measured leakage currents through the tracking cells may be stored in the configuration cells directly.

Although read management component 114 is shown as a portion of controller 108, in other examples, read management component 114 may be separate from, but coupled to, controller 108. As used herein, a storage system (e.g., 102), a controller (e.g., 108), a memory (e.g., 106), a memory array (e.g., 110), and/or a read management component (e.g., 114) may separately be considered an "apparatus."

Figure 1B:
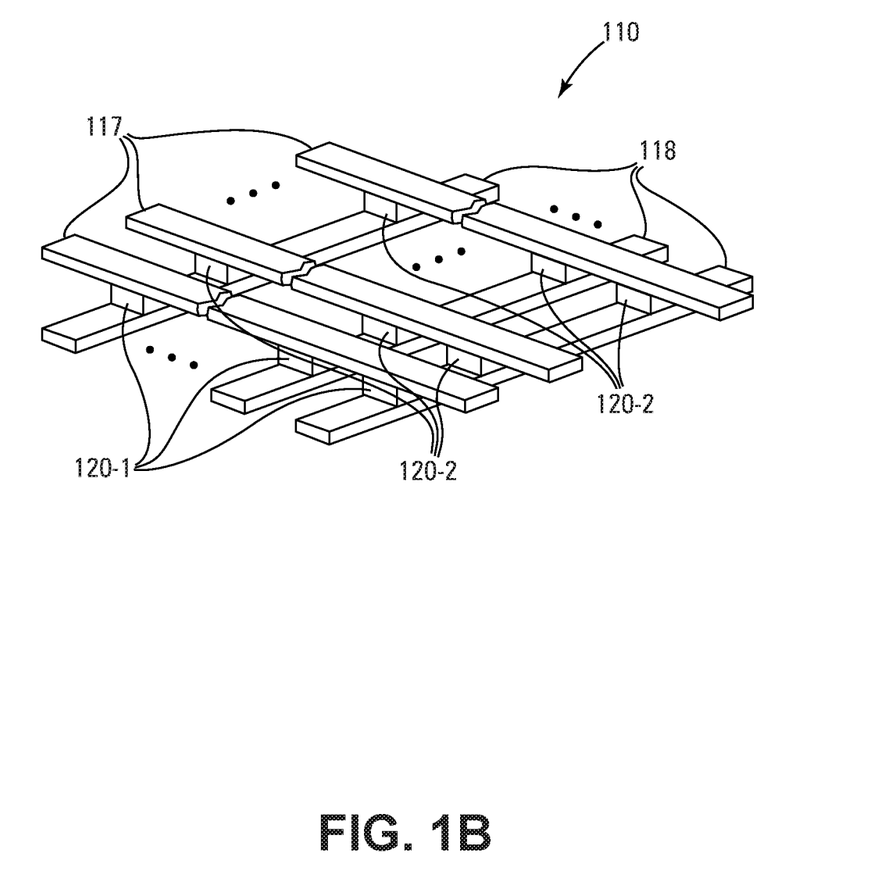
FIG. 1B illustrates an example of a portion of the memory array shown in FIG. 1A on which sub-threshold voltage leakage current tracking may be performed, in accordance with a number of embodiments of the present disclosure.

FIG. 1B illustrates an example of a portion of the memory array 110 shown in FIG. 1A. Memory array 110 may include signal lines 117, such as word lines, and signal lines 118, such as bit lines, that cross each other (e.g., intersect in different planes). For example, each of signal lines 117 may cross signal lines 118. A memory cell 120 may be between a signal line 117 and a signal line 118 (e.g., at each signal line 117/signal line 118 crossing). In some examples, memory cells 120-1 may be tracking memory cells 120-1 corresponding to memory cells 120-2. A sensing voltage may be determined from a leakage current through tracking memory cells 120-1. Memory cells 120-1 and 120-2 or just memory cells 120-2 may be read using the sensing voltage.

In some examples, tracking memory cells 120-1 may be updated (e.g., rewritten) each time memory cells 120-2 are written, so that tracking memory cells 120-1 and memory cells 120-2 experience the same number of write cycles.

To determine the leakage current, the sub-threshold voltage may be applied to memory cells 120-1. The applied sub-threshold voltage may be a difference between a voltage applied to the signal line 117 commonly coupled to memory cells 120-1 and a voltage applied to signals lines 118. For example, the sub-threshold voltage may be applied to the signal line 117 commonly coupled to memory cells 120-1 while signals lines 118 are grounded (e.g., at zero volts). Reading memory cells 120 may include applying the sensing voltage to memory cells 120. The sensing voltage may be a difference between a voltage applied to signal lines 117 and a voltage applied to signals lines 118. For example, the sensing voltage may be applied to signal lines 117 while signal lines 118 are grounded.

Memory cells 120 may constitute a page of memory cells that includes tracking memory cells 120-1 and memory cells 120-2. For example, the page of memory cells may be read using the sensing voltage. In another example, just memory cells 120-2 may be read using the sensing voltage. For example, memory cells 120-2 may constitute a page of memory cells, and tracking memory cells 120-1 may correspond (e.g., be assigned) to that page. A page of memory cells can refer to a number (e.g., a set) of memory cells that are concurrently (e.g., simultaneously) read and/or written (e.g., programmed) as a group.

In some examples, memory cells 120-1 and 120-2 may constitute a wear leveled group of pages in which memory cells 120-2 constitute a number of pages of the wear leveled group and tracking memory cells 120-1 may constitute a tracking page of the wear leveled group. For example, the number of pages of the wear leveled group may be read using the sensing voltage determined from a leakage current through the memory cells of the tracking page.

In some examples, there may be a number of groups of wear leveled pages. Each group may store a different type of data. The different groups may store data that is updated at different frequencies. FIG. 1B may illustrate one the number of different groups. For example, each group may have a tracking page of memory cells 120-1 and a number of pages 120-2.

Memory cells 120 can be, for example, resistance variable memory cells whose respective states (e.g., stored data values) depend on the respective programmed resistances of the memory cells. Memory cells 120 can be rewritten by overwriting them without first erasing them, in some examples. This can be referred to as writing in place.

Memory cells 120 can comprise a select element (e.g., a diode, transistor, or other switching device) in series with a storage element (e.g., a phase change material, metal oxide material, and/or some other material programmable to different resistance levels). For example, the storage element may be programmed to a state corresponding a value of a fraction of a bit, a single bit, or multiple bits. The select element may be used to access the storage element in the same memory cell.

The select element may include a material, at least a portion of which, may change (e.g., switch) between a non-conductive state and a conductive state. For example, the select element may be turned on (e.g., changed from a non-conductive state to a conductive state) to access the storage element. In some examples, the select element may include a variable resistance material (e.g., phase-change material). However, the material of the select element may be such that it may operate only as a switch (e.g., not to store information) to allow access to the storage element. For example, the select element may include a chalcogenide material that may not change phase.

The storage element may include a material, at least a portion of which, may be changed (e.g., via a programming operation) between different states (e.g., different material phases). The different states may have a range of different resistance values, for example, to represent different states of a memory cell 120. For example, the storage element may include a chalcogenide material that may be formed of various doped or undoped materials, that may or may not be a phase-change material, and that may or may not undergo a phase change during reading and/or programming the memory cell. In some examples, the storage element may include a phase change material (e.g., phase change chalcogenide alloy), such as an indium(In)-antimony(Sb)-tellurium(Te) (IST) material (e.g., $In_2Sb_2Te_5$, $In_1Sb_2Te_4$, $In_1Sb_4Te_7$, etc.) or a germanium (Ge)-antimony (Sb)-tellurium (Te) (GST) material (e.g., $Ge_2Sb_2Te_5$, $Ge_1Sb_2Te_4$, $Ge_1Sb_4Te_7$, etc.). The hyphenated chemical composition notation, as used herein, indicates the elements included in a particular mixture or compound, and is intended to represent all stoichiometries involving the indicated elements. Other storage element materials can include GeTe, In—Se, $Sb_2Te_3$, GaSb, InSb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other materials.

In other examples memory cells 120 may include a material, such as a phase change material, that may act as a select element and a storage element, so that memory cells 120 may act as both a selector device and a memory element. Some such cells may be referred to as self-selecting memory (SSM) cells.

Figure 2:
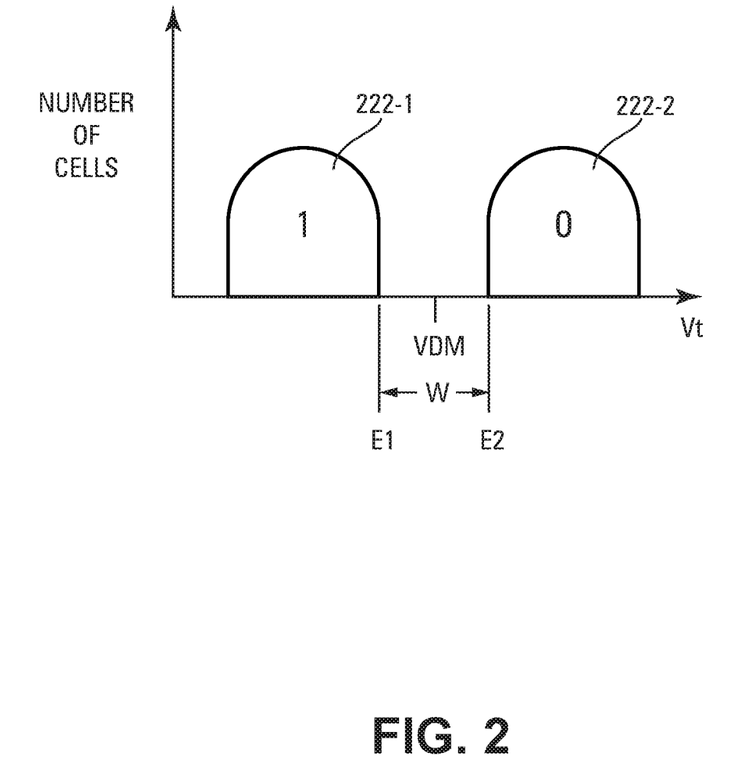
FIG. 2 illustrates threshold voltage distributions corresponding to respective states of cells operable in accordance with a number of embodiments of the present disclosure.

FIG. 2 illustrates threshold voltage distributions 222-1 and 222-2 corresponding to respective states of cells (e.g., cells 120) operable in accordance with a number of embodiments of the present disclosure. As an example, distribution 222-1 may be referred to as a "set" state, which can correspond to a low Vt state, and distribution 222-2 may be referred to as a "reset" state, which can correspond to a high Vt state (e.g., a state corresponding to relatively high Vt levels as compared to the Vt levels corresponding to the set state). In this example, distribution 222-1 corresponds to cells programmed to store a logic "1" and distribution 222-2 corresponds to cells programmed to store a logic "0"; however, embodiments are not limited to this assigned encoding.

In FIG. 2, "VDM" represents a sensing voltage used to determine the stored state of a cell (e.g., "1" or "0"). For example, memory cells 120 may be sensed using sensing voltage VDM. Sensing voltage VDM that may be determined in accordance with a number of embodiments of the present disclosure. An edge voltage E1 may be defined as the Vt corresponding the upper edge of distribution 222-1, and an edge voltage E2 may be defined as the Vt corresponding the lower edge of distribution 222-2. A window (e.g., margin) W is the difference between E2 and E1. For example, W=E2−E1.

The Vts of memory cells 120 that are programmed to state 1, and thus the edge voltage E1 of distribution 222-1, can vary with the number of write cycles of the memory cells 120 and with the age of those memory cells 120 (e.g., the time since memory cells 220 were last written to). Similarly, the Vts of memory cells 120 that are programmed to state 0, and thus the edge voltage E2 of distribution 222-2, can vary with the number of write cycles of the memory cells 120 and with the age of those memory cells 120. For example, the Vts and the voltages E1 and E2 may monotonically increase with age.

Figure 3A:
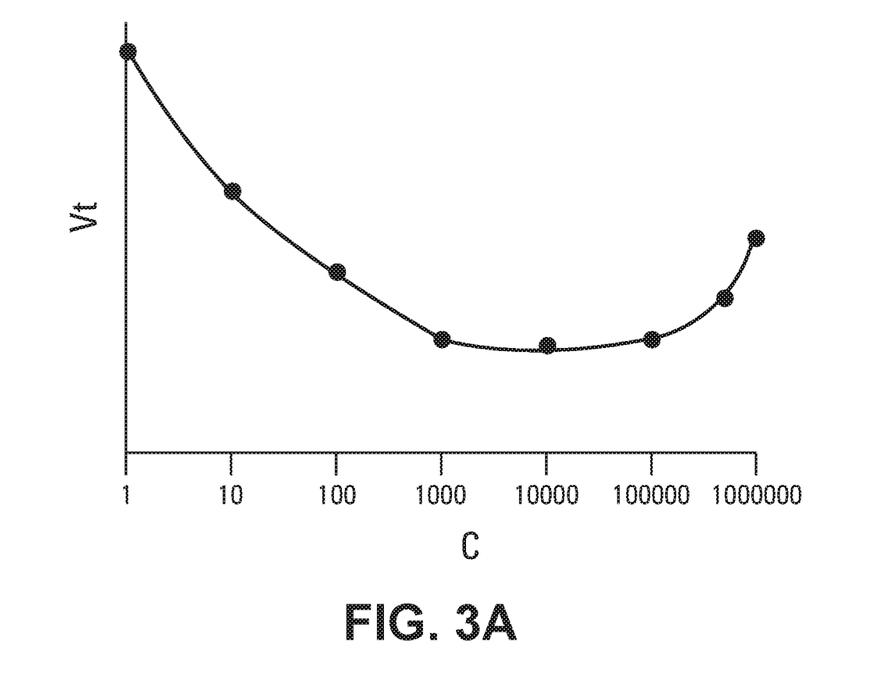
FIG. 3A illustrates the threshold voltage of memory cells as a function of a number of write cycles, in accordance with a number of embodiments of the disclosure.

FIG. 3A illustrates an example of experimentally determined Vt evolution of memory cells (e.g., 120) operable in accordance with embodiments of the present disclosure. The example shown in FIG. 3A represents the Vt evolution associated with a set state (e.g., 222-1) as a function of cycling (e.g., write cycles "C"); however, a similar Vt evolution curve may be observed for the reset state (e.g., 222-2). As shown in FIG. 3A, the set state Vt initially decreases with C to a minimum value and subsequently increases with C. It can be beneficial and/or necessary to adjust the sensing voltage (e.g., VDM) used to read cells as the Vt evolves (e.g., in order to provide adequate reliability).

The point at which the Vt achieves a local minimum may be referred to as "turnaround". As shown in FIG. 3A, the Vt turnaround may occur in a range from about $10^4$ to $10^5$ cycles. Subsequent to the turnaround due to cycling, the size of the read window W may decrease (and may eventually close), which can result in decreased read reliability. For instance, in some previous read approaches, sensing voltage VDM may be predetermined and fixed, such that it may not be adaptable to the Vt evolution.

In various instances, a rejuvenation process may be used to counteract the Vt evolution of memory cells 120 due to cycling (e.g., wear). For example, a pulse, which may be referred to as a rejuvenation pulse may be applied to cells to restore the Vt behavior to that associated with a lower quantity of cycles. For instance, application of the rejuvenation voltage pulse may restore the Vt of the memory cells to the Vt corresponding to a cycle count of zero. In some examples a rejuvenation pulse can be reset pulse and can have a greater magnitude and/or longer duration that a typical write pulse.

The rejuvenation process may, for example, increase the size of window W. Therefore, it may be beneficial to determine the C value corresponding to the minimum Vt in order to determine the C value at which to apply the rejuvenation voltage pulse. For example, rejuvenation may occur after a particular quantity of cycles subsequent to the C value corresponding to the Vt minimum value (e.g. at a C value corresponding to ten times that of the C value corresponding to the Vt minimum).

Figure 3B:
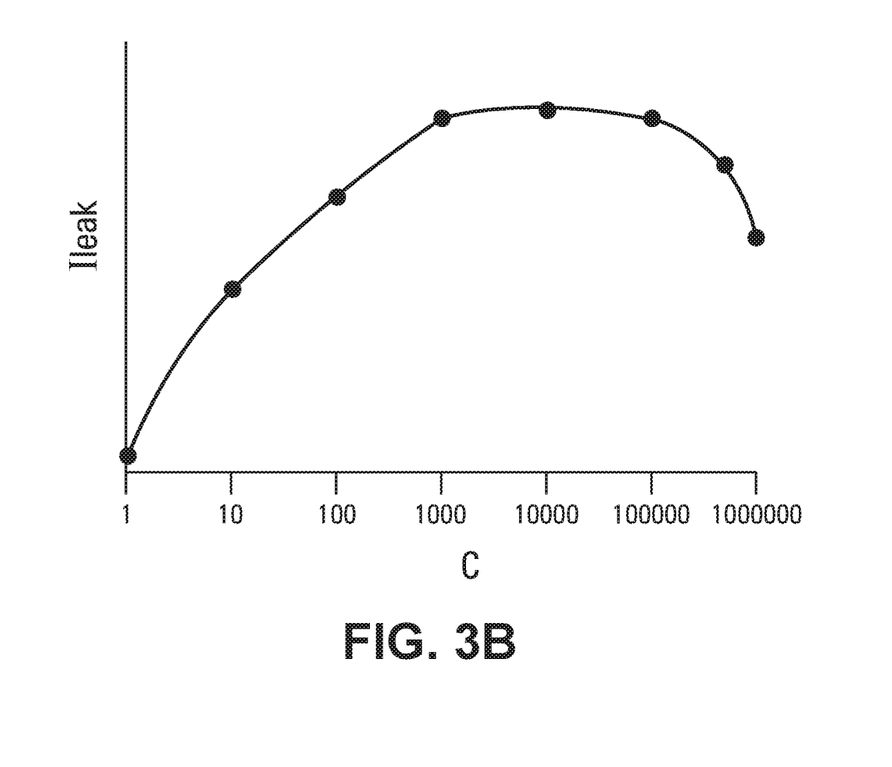
FIG. 3B illustrates sub-threshold leakage current as a function of a number of write cycles, in accordance with a number of embodiments of the disclosure.
Figure 3C:
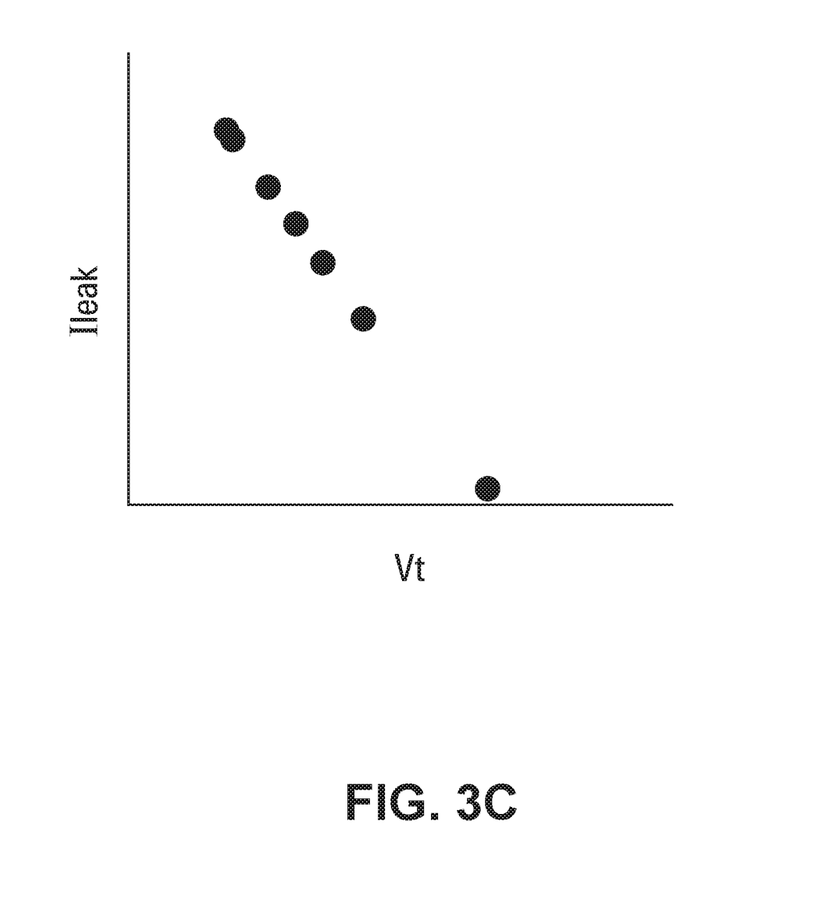
FIG. 3C illustrates a correlation between the sub-threshold leakage current and a threshold voltage, in accordance with a number of embodiments of the present disclosure.

As shown in FIG. 3B, sub-threshold current leakage evolution associated with memory cells (e.g., 120) correlates well with the Vt evolution shown in FIG. 3A. FIG. 3B illustrates the sub-threshold leakage current Ileak associated with memory cells (e.g., 120) programmed to the set state (e.g., 222-1) as a function of the number of write cycles C. In some examples, Ileak can be the leakage currents through a number of individual memory cells, such as tracking memory cells. As shown in FIG. 3C, the Ileak evolution as a function of cycling strongly correlates with Vt evolution as a function of cycling. For example, as shown in FIG. 3B, Ileak experiences a local maximum (e.g., where Ileak starts to decrease with increasing C) at a same or similar C value at which Vt experiences a local minimum (e.g., where Vt starts to increase with increasing C). Therefore, as described further herein, the Vt evolution can be tracked by tracking the Ileak evolution. Accordingly, tracking Ileak corresponding to one or more memory cells can be used to determine, for instance, an appropriate sensing voltage (e.g., VDM) for reading the cells and/or a cycle count at which to perform a rejuvenation process on the cells.

FIG. 3C illustrates a correlation (e.g., linear) between Ileak and Vt associated with memory cells (e.g., 120) operable in accordance with a number of embodiments of the present disclosure. As shown in FIG. 3C, increased cell conductivity in the sub-Vt region correlates to lower Vt values (e.g., Ileak increases as Vt decreases). The correlation may be used to determine (e.g., estimate and/or predict) cell Vts from measured Ileak values. For instance, a determined median Ileak value corresponding to a group of cells (e.g., a page) can be used to predict the median Vt distribution of the group of cells. Accordingly, the VDM used to read the cells can then be adjusted based on the predicted median Vt distribution. In some examples, the correlation may be in the form of an equation of a line passing through the data symbols in FIG. 3C, such as an equation obtained from applying a least squares regression analysis to the data points corresponding to the data symbols in FIG. 3C. The resulting equation may be used by read management component 114 to determine a Vt for a measured Ileak value. Alternatively, the Ileak values corresponding to the data symbols in FIG. 3C may be tabulated for the corresponding Vt values in a look-up table. Read management component 114 use the look-up table to determine a Vt for a measured Ileak value.

Figure 4:
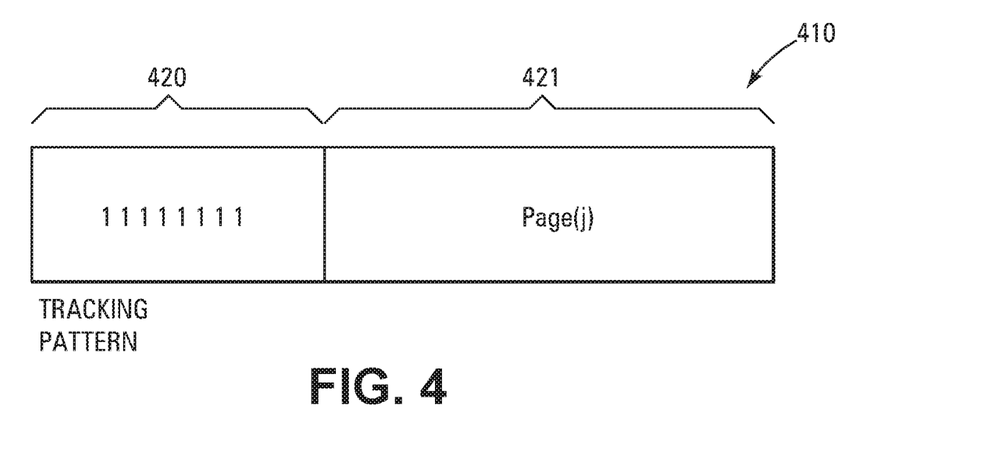
FIG. 4 illustrates an example in which a group of tracking memory cells is associated with a respective page of a memory array to be read, in accordance with a number of embodiments of the present disclosure.

FIG. 4 illustrates an example in which a group of tracking memory cells is associated with respective page of a memory array 410, in accordance with a number of embodiments of the present disclosure. For example, memory array 410 may be a portion of memory array 110. In the example of FIG. 4, a number (e.g., a set) of tracking memory cells 420 corresponds to a respective page(j) of memory cells 421. For example, page (j) may be the jth page of a number of such pages, such as L pages, and a respective number of tracking memory cells may correspond to each respective page. In some examples, tracking memory cells 420 may store a tracking pattern that may, for example, be all 1s, as shown. For example, each of tracking memory cells 420 may be programmed to the 1 state. As described in more detail below in conjunction with FIG. 7, in some embodiments, the tracking pattern may include a split of "1s" and "0s" such that the pattern may be used in association with write in-place or write out-of-place operations.

A respective leakage current may be determined from each respective set of tracking cells, such as tracking cells 420-1 in FIG. 4. A respective sensing voltage may be determined for each respective sensing voltage. For example, a sensing voltage to be used to read page(j) may be determined from the leakage current through tracking cells 420.

Figure 5:
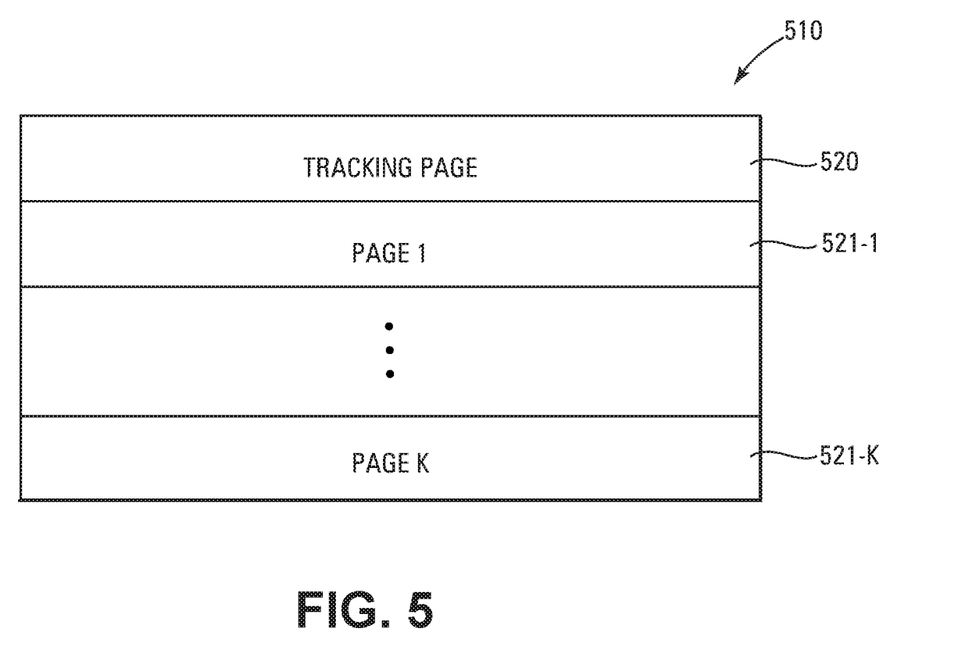
FIG. 5 illustrates an example in which a tracking page is associated with multiple pages of a memory array to be read, in accordance with a number of embodiments of the present disclosure.

FIG. 5 illustrates an example in which a tracking page is associated with multiple pages of a memory array 510 to be read, in accordance with a number of embodiments of the present disclosure. Wear leveling component 112 may wear memory array 510 so that the pages may experience a similar (or the same) quantity of write cycles. Memory array 510 may be a portion of memory array 110.

Memory array 510 includes a tracking page of tracking memory cells 520. Page 1 to page K respectively include memory cells 521-1 to 521-K. The tracking page may be programmed to a tracking pattern of all 1s or may be programmed to include a split of 1s and 0s. A sensing voltage may be determined from a leakage current through the tracking memory cells 520 and may be used to read each of page 1 to page K.

Figure 6:
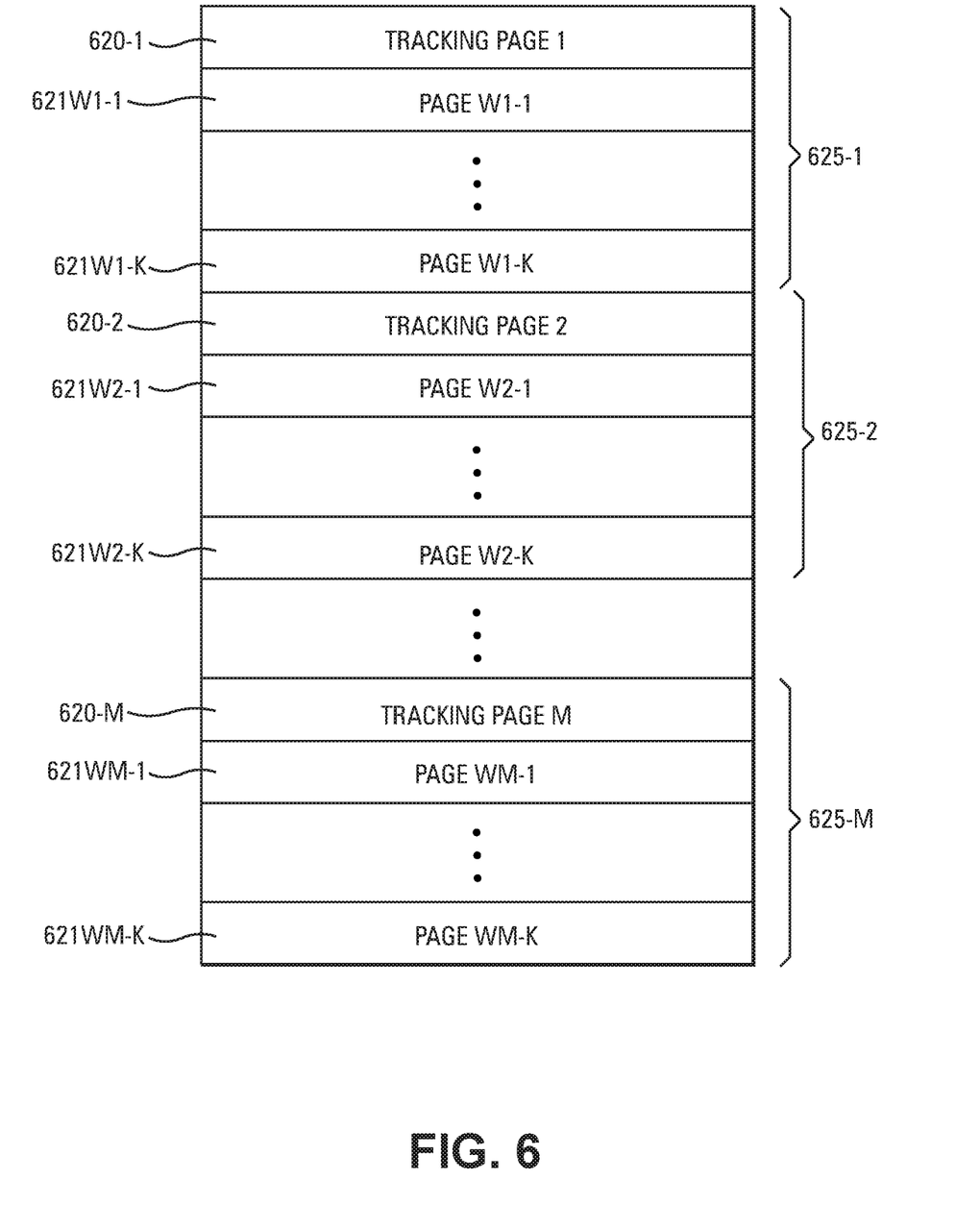
FIG. 6 illustrates an example in which tracking pages are associated with respective groups of pages corresponding to respective wear leveling domains, in accordance with a number of embodiments of the present disclosure.

FIG. 6 illustrates an example in which tracking pages are associated with respective groups of pages corresponding to respective wear leveling domains. For example, memory array 610 may be a portion of memory array 110. In FIG. 6, there a M groups (e.g., domains) of wear leveled pages, such as groups 625-1 to 625-M of wear leveled pages. For example, wear leveling component 112 may wear level groups 625-1 to 625-M so the pages in the respective groups experience a similar (e.g., the same) number of write cycles. In some examples, groups 625-1 to 625-M may respectively store M different types of data. For example, the pages in the different groups may be updated (e.g., rewritten) different numbers of times.

Groups 625-1 to 625-M respectively include tracking page 1 to tracking page M. Tracking page 1 to tracking page M respectively include a number of tracking cells 620-1 to a number of tracking cells 620-M. Groups 625-1 to 625-M respectively include a number of pages. For example, group 625-1 includes page W1-1 to page W1-K; group 625-2 includes page W2-1 to page W2-K; and group 625-M includes page WM-1 to page WM-K. Page W1-1 to page W1-K respectively include memory cells 621W1-1 to 621W1-K; page W2-1 to page W2-K respectively include memory cells 621W2-1 to 621W2-K; and page WM-1 to page WM-K respectively include memory cells 621WM-1 to 621WM-K.

In some examples, tracking page 1 to tracking page M may be programmed to a tracking pattern of all is or may be programmed to include a split of 1s and 0s. A respective sensing voltage may be determined from a respective leakage current through the respective tracking memory cells 620-1 to 620_M. The respective sensing voltages may be used to read the pages in the respective groups 625-1 to 625-M.

Figure 7:
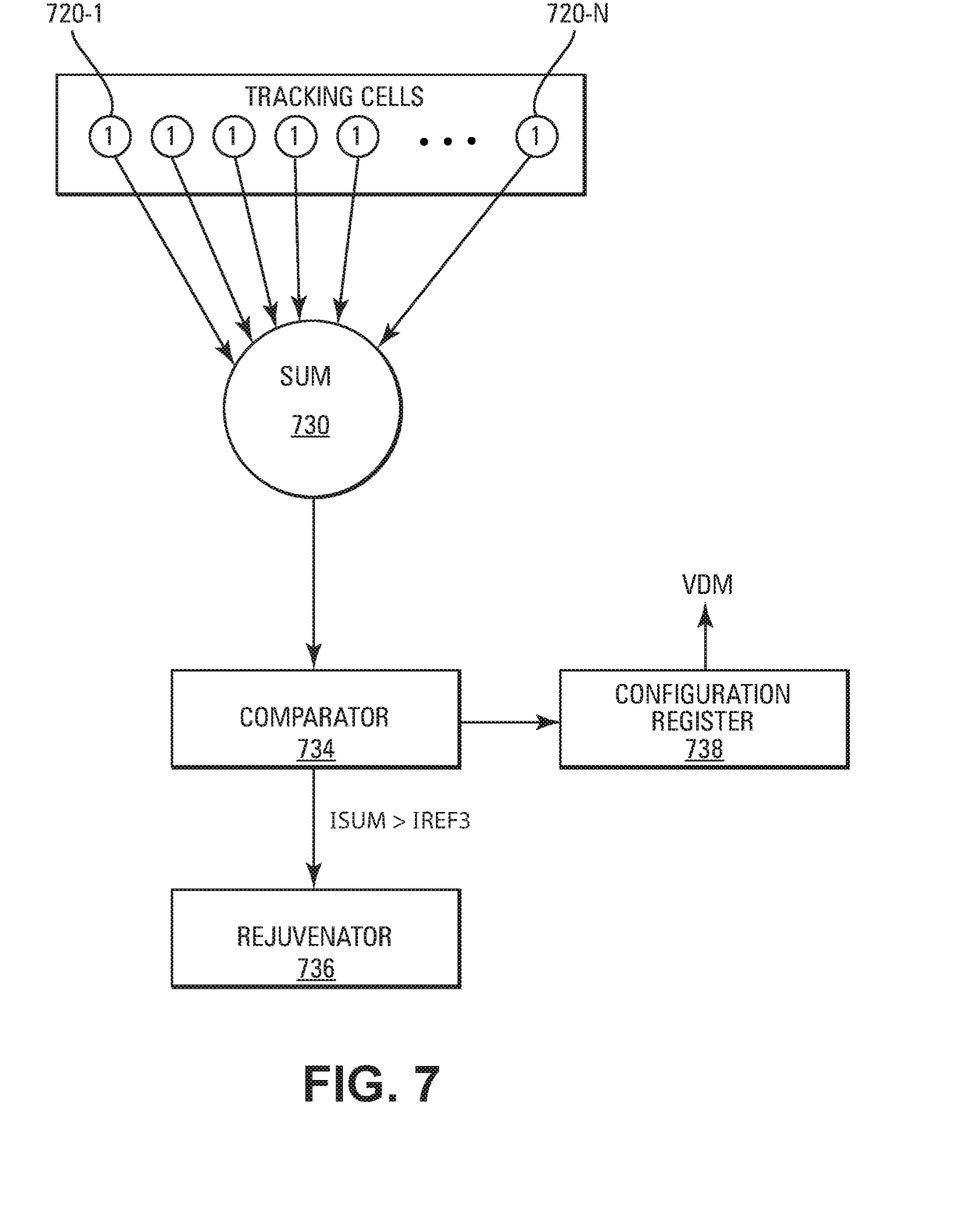
FIG. 7 is a block diagram associated with sub-threshold leakage current tracking, in accordance with a number of embodiments of the present application.

FIG. 7 is a block diagram associated with sub Vt leakage current tracking in accordance with a number of embodiments of the present application. FIG. 7 includes a group of tracking cells 720-1 to 720-N, which may be tracking cells such as those described above. For example, tracking cells 720-1 to 720-N may be portion of a page of memory cells to be read with a determined VDM or a page of tracking memory cells associated with a group of wear leveled pages to be read with the determined VDM. FIG. 7 also shows a summing component 730 coupled to the tracking cells and to a comparator 734. Comparator 734 is coupled to a configuration register 738, such as a volatile register, and, in some embodiments, to a rejuvenator 736. For example, summing component 730, comparator 734, rejuvenator 736, and configuration register 738 may be part of read management component 114. In some examples, configuration register 738 may be part of volatile memory 116.

In this example, the tracking cells 720 are each programmed to a set state (e.g., such that the tracking pattern is all "1s"). In a number of embodiments, the tracking pattern (e.g., the data pattern stored by the tracking cells 720) may comprise a split of "1s" and "0s" such that the pattern may be used in association with write in-place or write out-of-place operations. Tracking cells 720-1 to 720-N and the N additional tracking cells may be alternately programmed to state 1 and state 0. For example, tracking cells 720-1 to 720-N may be programmed to state 1 while the N additional tracking cells are programmed to state 1 and vice versa. The leakage current may be determined from the tracking cells currently programmed to state 1. Alternating programming reduces the likelihood of the set-on-set problem that can occur by repeatedly programming cells to the same state, such as state 1, which may occur when the tracking cells are written in place each time the cells corresponding to the tracking cells are written in place.

As shown in FIG. 7, a summing component 730 can be used to sum the individual leakage currents through the N tracking cells 720 (e.g., those tracking cells programmed to the set state). The summed current (e.g., ISUM) can be provided to current comparator 734.

Different configuration patterns correspond to different sensing voltages and may include various combinations of binary bits, such as 1s and 0s. Comparator 734 assigns the combinations of bits based on comparisons of ISUM to various reference currents, such as IREF1<IREF2<IREF3, and outputs them to configuration register 738 or directly to non-volatile memory 106. For example, comparator may output a configuration pattern corresponding a sensing voltage VDM1 when ISUM is less than IREF1, output a configuration pattern corresponding to VDM2<VDM1 when ISUM greater than IREF1 and less than IREF2, and output a configuration pattern corresponding to VDM3<VDM2 when ISUM greater than IREF3.

In some examples, the configuration patterns may be copied from configuration register 738 into memory array 110 while storage system 102 is powering down and copied back to configuration register 738 while storage system 102 is powering up. The sensing voltage corresponding to the configuration pattern is used to read the memory cells corresponding the tracking cells. and, in some instances, the tracking memory cells themselves (e.g., if the cells corresponding to a page being read are themselves used to determine the sub-threshold leakage current).

In some examples, VDM may be determined from a look-up table or an equation for ISUM. The VDM may then be assigned a configuration pattern that is stored in configuration register 738 or directly in non-volatile memory 106.

In some examples, in response to ISUM being greater than IREF3, read management component 114 may instruct a rejuvenator 736 to rejuvenate the tracking memory cells and/or the memory cells corresponding to the tracking memory cells. Rejuvenator 736 may apply a rejuvenation voltage pulse to those memory cells in response to ISUM being greater than IREF3. For example, rejuvenator 736 may rejuvenate a page of memory cells corresponding to and/or including the target memory cells or a group of wear leveled pages corresponding to and/or including a page of the target memory cells. In some examples, IREF3 may correspond to a particular number of cycles after which Ileak attains a maximum value, but before the window closes.

In some examples, the configuration pattern may be stored directly in memory array 110. For example, the configuration pattern may be stored in a portion of a page that includes the tracking cells. The configuration pattern may be stored in configuration memory cells, such as resistance variable memory cells similar to memory cells 120 previously described.

Figure 8A:
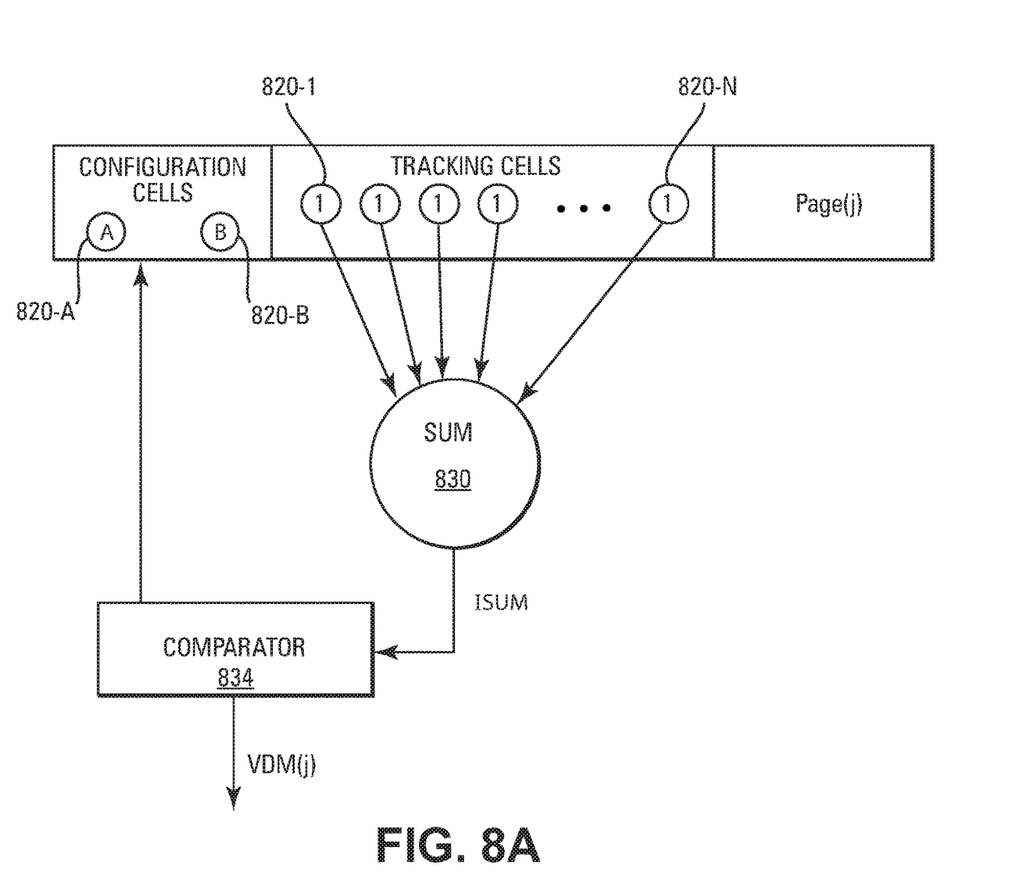
FIG. 8A is a block diagram of associated with sub-threshold leakage current tracking without wear leveling, in accordance with a number of embodiments of the present application.

FIG. 8A is a block diagram of associated with sub-threshold leakage current tracking without wear leveling, in accordance with a number of embodiments of the present application. In the example of FIG. 8A, non-volatile tracking memory cells 820-1 to 820-N are added to a respective page(j) of memory cells, and a pair of non-volatile configuration memory cells 820-A and 820-B are added to the page(j). For example, page(j), memory cells 820-A and 820-B, and tracking memory cells 820-1 to 820-N can be in memory array 110 and can have the same page address. Page (j) may be the jth page of a number of such pages, such as L pages, and a respective number of tracking memory cells and a respective pair of configuration cell may correspond to each respective page. For example, the L pages might not be wear leveled.

Tracking memory cells 820-1 to 820-N may store a tracking pattern that may, for example, be all 1s, as shown. For example, tracking memory cells can be programmed to the set state. In some embodiments, the tracking pattern may include a split of "1s" and "0s" such that the pattern may be used in association with write in-place or write out-of-place operations.

FIG. 8A shows a summing component coupled to the tracking memory cells and to a comparator 834 that is coupled to the configuration cells. As shown in FIG. 8A, summing component 830 can be used to sum the individual leakage currents through the N tracking cells 820-1 to 820-N. The summed current (e.g., ISUM) can be provided to current comparator 834. Comparator 834 can assign a configuration pattern (e.g., of 1s and 0s) based on the received ISUM and output the configuration pattern for direct storage by the configuration cells. The configuration pattern can be read from the configuration cells, and the corresponding sensing voltage VDM(j) can be used to read the page (j).

The configuration pattern can be read from the configuration cells using a ramp voltage. For example, the ramp voltage is used because the read voltage for the configuration cells is unknown.

Figure 8B:
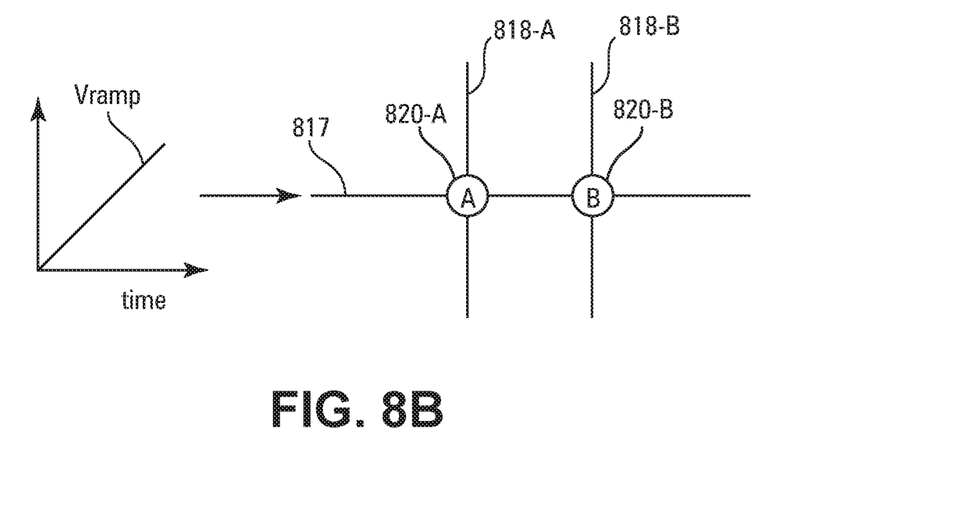
FIG. 8B illustrates reading a pair of configuration cells with a ramp voltage to determine a sensing voltage, in accordance with a number of embodiments of the present disclosure.

FIG. 8B illustrates reading configuration cells 820-A (cell A) and 820-B (cell B) with a ramp voltage, in accordance with a number of embodiments of the present disclosure. Cells 820-A and 820-B are commonly coupled to a signal line 817, such as a word line, and are respectively coupled to signal lines 818-A and 818-B, such as bit lines. A timewise increasing ramp voltage is applied to cells 820-A and 820-B. For example, the ramp voltage applied to cells 820-A and 820-B may be the difference between a ramp voltage applied signal line 817 and a voltage applied to signal lines 818-A and 818-B. In the example of FIG. 8A, a ramp voltage Vramp is applied to cells 820-A and 820-B by applying Vramp to signal line 817 while signal lines 818-A and 818-B are grounded.

If cell 820-A or 820-B experiences a switching event in response to Vramp, then that cell is at state 1. If cell 820-A or 820-B does not experience a switching event in response to Vramp, then that cell is at state 0.

Figure 8C:
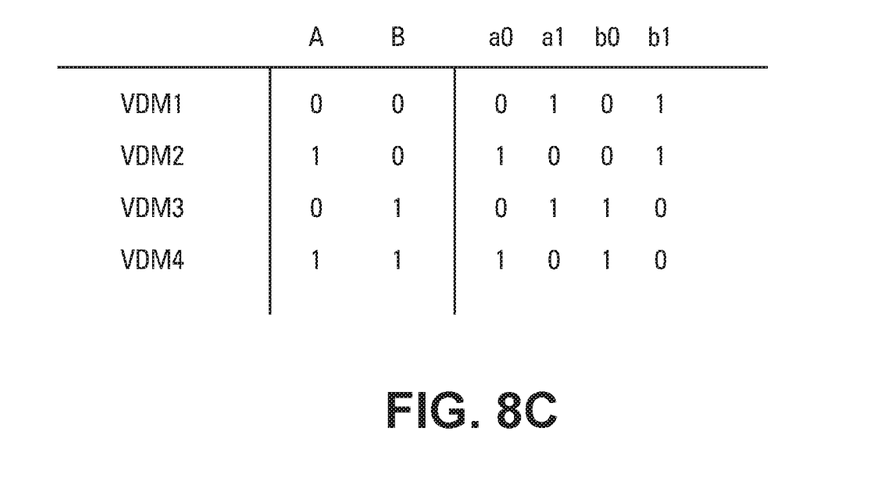
FIG. 8C illustrates configuration patterns corresponding to different sensing voltages, in accordance with a number of embodiments of the present disclosure.

FIG. 8C illustrates configuration patterns corresponding to different VDMs, such as VDM1 to VDM4, and to the different states of the pair of cells 820-A and 820-B (e.g., respectively denoted as A and B), in accordance with a number of embodiments of the present disclosure. In FIG. 8C, the combination of code bits a0, a1, b0, and b1 corresponds to the configuration pattern. The code bits a0 and a1 correspond to the various states of cell 820-A, and the code bits b0 and b1 correspond to the various states of cell 820-B. For example, code bits 01 correspond to state 0 of cell 820-A or 820-B, and code bits 10 correspond to state 1 of cell 820-A or 820-B.

In some examples, the leakage current, such as ISUM, and the VDM based thereon may be determined directly from the memory cells (e.g., a page or group of pages of memory cells) that are to be read with VDM. For example, a certain number (e.g., at least 50%) of the cells to be read would need to be at state 1. For example, the data pattern (e.g., codeword) stored by the cells should have at least 50% ones. The codeword may be balanced codeword having an equal number of ones and zeros, which may be accomplished via various balanced code and/or weighted code (e.g., constant weight coding) techniques known in the art. In another example, an inversion may be performed on a codeword determined to have less than 50% ones, such that the "0s" are flipped to "1s" and vice versa, which results in the inverted codeword having greater than 50% ones.

A respective leakage current and corresponding sensing voltage may be determined before each respective read operation. This can give the most accurate and most reliable sensing voltage for the read. Alternatively, the leakage current and corresponding sensing voltage may determine in the background as a background operation.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method, comprising:
    determining a sub-threshold leakage current through a first number of memory cells, wherein the first number of memory cells comprises a first page of memory cells of a wear leveled group of pages of memory cells;
    determining a threshold voltage based on the sub-threshold leakage current; and
    reading at least a second number of memory cells using the threshold voltage, the second number of memory cells comprises a number of second pages of memory cells of the wear leveled group of pages of memory cells.

2. The method of claim 1, further comprising reading the first number of memory cells using the threshold voltage.

3. The method of claim 1, wherein the sub-threshold leakage current is a sum of sub-threshold leakage currents through each of the first number of memory cells.

4. The method of claim 1, wherein determining the threshold voltage based on the sub-threshold leakage current, comprises determining a threshold voltage of the first number of memory cells based on the current and adding a particular voltage to threshold voltage.

5. A method, comprising:
    determining a sub-threshold leakage current through a first number of memory cells;
    determining a threshold voltage based on the sub-threshold leakage current;
    reading at least a second number of memory cells using the threshold voltage; and
    storing the threshold voltage in volatile memory.

6. The method of claim 5, further comprising reading the threshold voltage from volatile memory before reading at least the second number of memory cells.

7. A method, comprising:
    determining a sub-threshold leakage current through a first number of memory cells;
    determining a threshold voltage based on the sub-threshold leakage current;
    reading at least a second number of memory cells using the threshold voltage; and
    storing the threshold voltage in non-volatile memory.

8. The method of claim 7, further comprising reading the threshold voltage from the non-volatile memory using a ramp voltage before reading at least the second number of memory cells.

9. The method of claim 8, wherein reading the threshold voltage from the non-volatile memory using the ramp voltage comprises determining a configuration pattern based on which memory cells of a number of memory cells in the non-volatile memory experiences a switching event in response to the ramp voltage.

10. A method, comprising:
- determining a sub-threshold leakage current through a first number of memory cells,
- wherein the first number of memory cells are all programmed to a set state;
- determining a threshold voltage based on the sub-threshold leakage current; and
- reading at least a second number of memory cells using the threshold voltage.

11. A method, comprising:
- determining a sub-threshold leakage current through a first number of memory cells;
- determining a threshold voltage based on the sub-threshold leakage current; and
- reading at least a second number of memory cells using the threshold voltage, wherein:
  - the first number of memory cells are a portion of a group of tracking memory cells comprising a third number of memory cells; and
  - the first number of memory cells are programmed to a set state and the third number of memory cells are programmed to a reset state.

12. The method of claim 11, further comprising:
- programming the first number of memory cells to the reset state;
- programming the third number of memory cells to the set state; and
- reading at least the second number of memory cells using a sensing voltage determined from sub-threshold leakage current through the third number of memory cells.

13. A method, comprising:
- determining a sub-threshold leakage current through a first number of memory cells;
- determining a threshold voltage based on the sub-threshold leakage current;
- reading at least a second number of memory cells using the threshold voltage; and
- writing the first number of memory cells each time the second number of memory cells are written.

* * * * *